(12) United States Patent
Kestermann et al.

(10) Patent No.: US 8,702,383 B2
(45) Date of Patent: Apr. 22, 2014

(54) SWITCHGEAR CABINET FOR A WIND TURBINE

(75) Inventors: Hermann Kestermann, Rheine (DE); Cathrin Zwartjes, Braunschweig (DE)

(73) Assignee: SSB Wind Systems GmbH & Co. KG

( * ) Notice: Subject to any disclaimer, the term of this patent is extended or adjusted under 35 U.S.C. 154(b) by 1045 days.

(21) Appl. No.: 12/677,560

(22) PCT Filed: Aug. 19, 2008

(86) PCT No.: PCT/EP2008/060843
§ 371 (c)(1),
(2), (4) Date: Mar. 11, 2010

(87) PCT Pub. No.: WO2009/033917
PCT Pub. Date: Mar. 19, 2009

(65) Prior Publication Data
US 2011/0037267 A1 Feb. 17, 2011

(30) Foreign Application Priority Data
Sep. 12, 2007 (DE) .................. 10 2007 043 503

(51) Int. Cl.
*F04D 29/70* (2006.01)
*F03D 11/00* (2006.01)

(52) U.S. Cl.
USPC ......................................... 415/175; 415/178

(58) Field of Classification Search
USPC ..................... 415/116, 175, 177, 178; 416/95
See application file for complete search history.

(56) References Cited

U.S. PATENT DOCUMENTS

| 7,594,800 B2* | 9/2009 | Teipen ................... 416/247 R |
| 8,186,940 B2* | 5/2012 | Landa et al. ............... 415/116 |
| 2002/0096346 A1 | 7/2002 | Maloney et al. |
| 2006/0120862 A1* | 6/2006 | Jannasch et al. ............ 415/175 |
| 2007/0119185 A1* | 5/2007 | Pfannenberg ................. 62/3.2 |

FOREIGN PATENT DOCUMENTS

| DE | 19502343 C2 | 4/2003 |
| DE | 202006006326 U1 | 3/2007 |
| JP | 08061724 A | 3/1996 |
| JP | 10132345 A | 5/1998 |
| JP | 10270878 A | 10/1998 |
| JP | 2003056880 A | 2/2003 |
| JP | 2006074956 A | 3/2006 |

OTHER PUBLICATIONS

International Preliminary Search Report for International Application No. PCT/EP2008/060843, mailed Jun. 15, 2010.

* cited by examiner

*Primary Examiner* — Edward Look
*Assistant Examiner* — Jesse Prager
(74) *Attorney, Agent, or Firm* — Gifford, Krass, Sprinkle, Anderson & Citkowski, P.C.

(57) ABSTRACT

A switchgear cabinet for a wind turbine has a cabinet housing with a ventilation hole defined therein. A fan is disposed in the cabinet housing and supported on the cabinet housing so as to be disposed in front of or in the ventilation hole. A circumferential coaming is disposed on the outer side of the cabinet housing surrounding the ventilation hole. A pan-shaped cover has a closed front and a rim. The cover is disposed over the coaming with the rim extending around the coaming. The cover is spaced from the coaming so as to define at least one air-permeable connection between the fan and the surroundings of the cabinet.

13 Claims, 3 Drawing Sheets

SWITCHGEAR CABINET FOR A WIND TURBINE

REFERENCE TO RELATED APPLICATIONS

This patent application is the United States national phase application of Patent Cooperation Treaty Application No. PCT/EP2008/060843, filed Aug. 19, 2008, which claims priority from German patent application No. DE 10 2007 043 503.9, filed Sep. 12, 2007, the entire content of both of which are incorporated herein by reference.

FIELD OF THE INVENTION

The invention relates to a switchgear cabinet for a wind turbine, having a cabinet housing in which at least one ventilation hole is provided, and at least one fan which is arranged in the cabinet housing and is fastened on the cabinet housing so as to lie in front of and/or in the ventilation hole. The invention furthermore relates to a wind turbine having such a switchgear cabinet.

BACKGROUND OF THE INVENTION

GB 1 199 831 A discloses a roof ventilation unit, in which two shutters, when in the closed state, form a cover for a fan. The shutters are hinged outside a tube in which the fan lies, in order to reduce the formation of turbulence in the air flow when the shutters are in the open state.

When the shutters are in the closed state, they close the air passage opening, and when the shutters are in the open state the fan is not protected against the ingress of water. Furthermore, the shutters and the fan are fastened on a roof and are not intended to be mounted on a switchgear cabinet.

DE 92 12 876 U1 describes a fan for connection to a space containing water droplets, having a fan housing with an axial air inlet and an outlet on the circumferential side, and a fan wheel arranged in the fan housing with a shaft and a shaft feed-through on the opposite side from the air inlet. The housing has a wall projection, which is for example shaped conically, surrounding the shaft feed-through on the housing side.

No measures are taken to prevent ingress of liquid into the fan housing; rather, this ingress is tolerated.

DE 196 36 500 C2 discloses a seal insert for electrical insulation equipment, which comprises a hollow cylindrical casing and a collar formed at a right angle thereon. At its outer edge, the collar is provided with a coaming, on the end of which an outwardly facing circumferential projection is formed which engages in the edge region of a cover frame, so as to prevent the ingress of moisture or water.

This arrangement can prevent only lateral but not frontal ingress of water, since the cover is configured as a frame. The installation equipment is furthermore provided for undersurface fitting and not for mounting in a switchgear cabinet.

Switchgear cabinets of the type mentioned in the introduction are known from the prior art and are used in wind turbines, for example to accommodate electronic components for controlling pitch drives, so that these switchgear cabinets are also referred to as pitch switchgear cabinets. In wind turbines, climate control of pitch switchgear cabinets is problematic when, with high ambient temperatures in the vicinity, high powers and therefore also high power losses occur in the switchgear cabinets since thermal dissipation through the switchgear cabinet surface is often insufficient by itself.

Although it would be possible to use heat exchangers in order to comply with the protection class, for reasons of space and costs this is generally not feasible. It is possible to use standard filter fans as an alternative, although they only achieve the required protection classes when the switchgear cabinet has a defined position so that no water can enter through slats or slits of the filter fan. This defined position is however not provided by pitch switchgear cabinets since they are arranged in the rotor or in the rotor hub of the wind turbine, and are subjected to a constant position change owing to the rotation of the rotor. The slats arranged on the outer side of commercially available filter fans point downwards in the normal fitting position, so that the air inlet opening of the fan is covered against water jets from above. When used in the rotor of a wind turbine, however, the filter fan also passes through positions in which the slats point upwards and therefore readily permit entry of water. In this context, a not inconsiderable amount of water is to be envisaged in the rotor hub (for example condensed water from the rotor blades).

SUMMARY OF THE INVENTION

The present invention refines a switchgear cabinet of the type mentioned in the introduction so that ingress of water into the fan can be prevented even with a constant position change.

The switchgear cabinet according to the invention for a wind turbine comprises a cabinet housing, in which at least one ventilation hole is provided, and at least one fan which is arranged in the cabinet housing and is fastened on the cabinet housing so as to lie in front of and/or in the ventilation hole. The opening of the ventilation hole is surrounded on the outer side of the cabinet housing by a circumferential coaming that engages in an interior of a cover, which is closed on the front and is provided on the outer side of the cabinet housing, so as to form at least one air-permeable connection between the fan and the surroundings of the cabinet housing.

The space surrounded or enclosed by the coaming, and therefore also the fan, are protected by the closed front of the cover against frontal ingress of water. Furthermore, the engagement of the coaming in the interior of the cover provides a labyrinth-like profile of the air-permeable connection, so that it is also possible to prevent lateral ingress of water into this space surrounded by the coaming, and therefore into the fan. In spite of the cover, air exchange is possible here between the inside of the housing and the surroundings owing to the air-permeable connection.

The air-permeable connection preferably extends at least in sections between the coaming and the cover, which lies at a distance from the circumferential surface, or from the enclosing outer surface of the coaming. Furthermore, the air-permeable connection preferably extends around the front edge of the coaming into the space surrounded or enclosed by the coaming, so that the front edge of the coaming lies in particular at a distance from the closed front of the cover.

The cover is preferably provided with a rim which extends around the coaming and in particular lies at a distance from the coaming, so that the air-permeable connection extends at least partially between the rim and the coaming. In this case, the space enclosed between the rim and the coaming is preferably a circumferential free space which, in particular, forms a section of the air-permeable connection. A relatively large air passage area is therefore available for the exchange of air between the inside of the housing and the surroundings. In particular, the rim engages at least partially over the coaming.

The circumferential surface, or the enclosing outer surface, of the coaming is preferably provided with a circumferential indentation so that water entering laterally cannot pass around the front edge of the coaming and enter the space surrounded or enclosed by the coaming. The indentation is in particular designed in a U-shape, V-shape or concavely.

The coaming may have a round, oval or polygonal circumferential contour. The cover furthermore preferably has a circumferential contour which follows the circumferential contour of the coaming, so that the cover may also have a round, oval or polygonal circumferential contour. The cover is in particular pan-shaped and/or U-shaped in cross section. The cover furthermore has an opening which faces towards the cabinet housing, through which the coaming engages in the interior of the cover, the outer surfaces of the cover preferably being designed to be impermeable to liquid or sprayed water.

The coaming is in particular fastened on the outer side of the cabinet housing, and may be formed integrally with it. Preferably, however, the coaming fastened on the outer side of the cabinet housing is a separate component. Furthermore, the connection between the coaming and the cabinet housing is in particular designed to be impermeable to liquid or sprayed water, so that ingress of liquid into a gap between the coaming and the cabinet housing can be prevented. The cover may also be fastened on the outer side of the cabinet housing. The cover is, however, preferably fastened on the coaming, in which case spacers may be provided between the coaming and the cover.

The fan arranged in the cabinet housing may lie in front of and/or engage in the ventilation hole. It is furthermore possible for the fan to engage through the ventilation hole and protrude on the outer side of the cabinet housing, so that the fan engages in the space surrounded or enclosed by the coaming and is therefore surrounded by the coaming.

The fan preferably comprises slats. The fan furthermore preferably comprises a filter or dust filter, which in particular is covered by the slats. It is therefore possible to use commercially available filters fans which can be obtained comparatively inexpensively.

The cover and the coaming may consist of metal and/or plastic. The cabinet housing may furthermore be made of metal and/or plastic. Preferably, the cabinet housing is formed as a closed housing which, in particular, is provided with a removable lid or an openable shutter or door in order to provide closable access to the interior of the housing.

The invention furthermore relates to a wind turbine having a holder, and a rotor which is mounted so as to rotate on the holder. The rotor has at least two rotor blades and is coupled to an electrical generator. At least one switchgear cabinet is fastened in or on the rotor, preferably in its rotor hub. The switchgear cabinet is in particular a switchgear cabinet according to the invention, which may be refined according to all the disclosed configurations.

BRIEF DESCRIPTION OF THE DRAWINGS

The invention will be described below with the aid of a preferred embodiment with reference to the drawings. In the drawings.

DETAILED DESCRIPTION OF THE DRAWINGS

Figure 1:
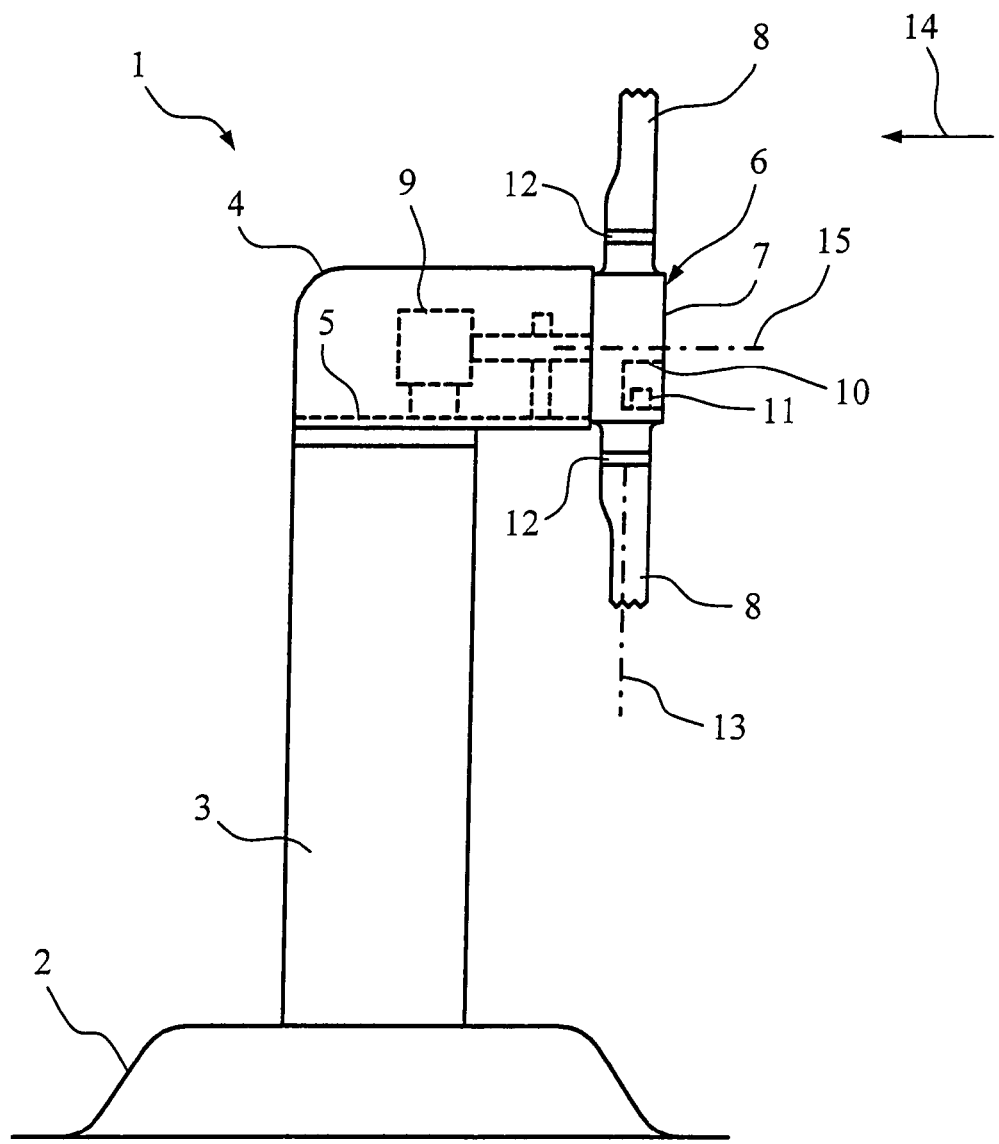
FIG. 1 shows a schematic representation of a wind turbine having a switchgear cabinet according to an embodiment of the invention.

FIG. 1 shows a schematic view of a wind turbine 1, with a tower 3 standing on a foundation 2, a power housing 4 disposed on the tower's end remote from the foundation 2. The power housing 4 comprises a holder or support 5, on which a rotor 6 is mounted so as to be able to rotate. The rotor 6 has a rotor hub 7 and rotor blades 8 connected thereto. The rotor 6 is mechanically coupled to an electrical generator 9, which is arranged in the power housing 4 and is fastened on the support 5.

A switchgear cabinet 10 is arranged and fastened in the rotor hub 7, and includes electronic components 11 which operate pitch drives 12 by means of which the rotor blades 8 can be rotated about their respective longitudinal axis 13 relative to the rotor hub 7. Since the rotor 6 is rotated by wind force 14 about a rotor axis 15, the switchgear cabinet 10 also rotates together with the rotor hub 7.

Figure 2:
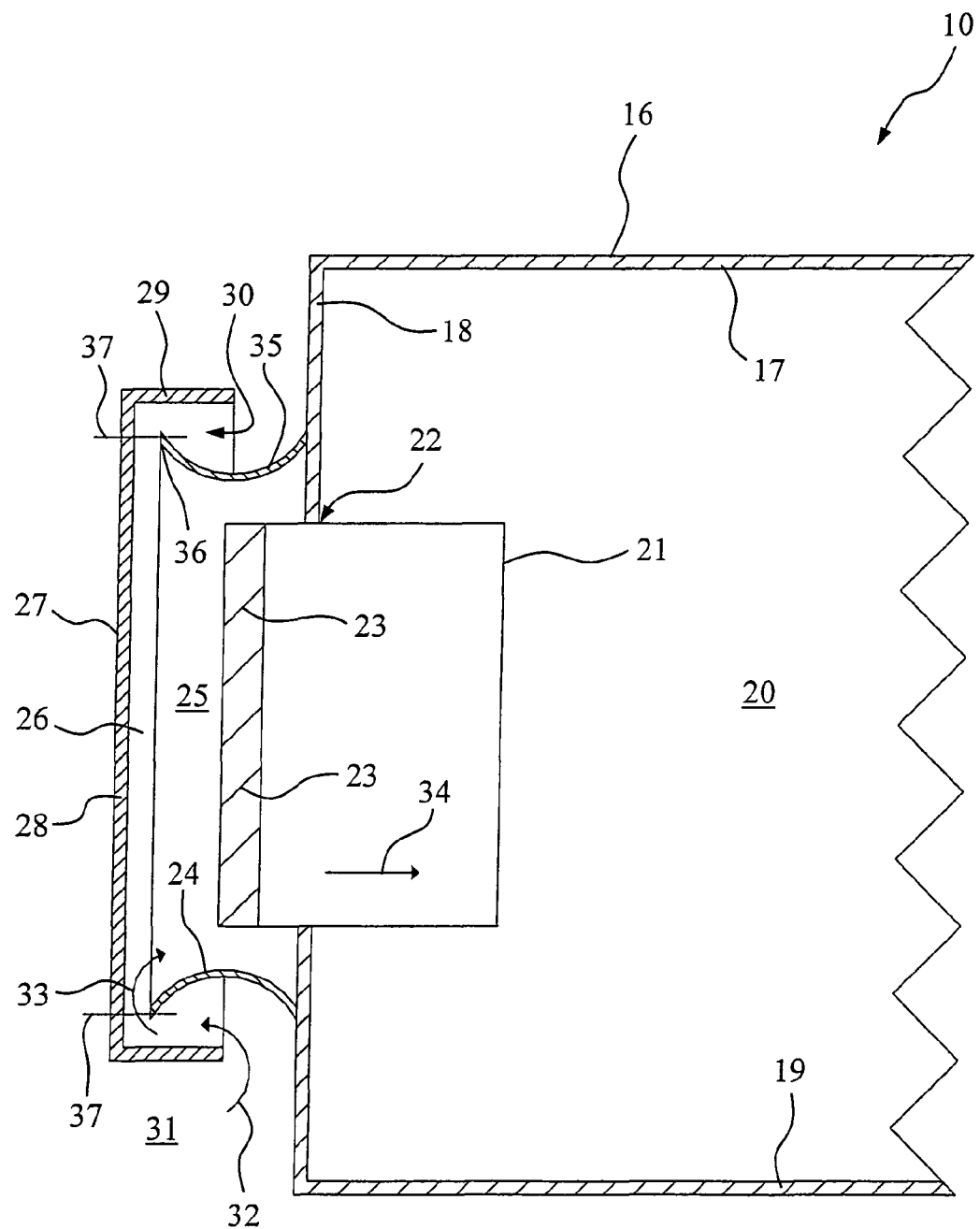
FIG. 2 shows a partial sectional view of the switchgear cabinet according to FIG. 1.

FIG. 2 shows a partial sectional view of the switchgear cabinet 10, which comprises a cabinet housing 16 with a plurality of walls 17, 18 and 19. A filter fan 21 is disposed and fastened in the interior 20 of the cabinet housing 16, and extends through a continuous ventilation hole 22 which is provided in the wall 18. The fan 21 has slats 23 on the front which, in the position of the switchgear cabinet 10 as shown, extend obliquely downwards from the fan 21. On the outer side of the housing 16, the opening of the ventilation hole 22 is surrounded or encircled by a circumferential coaming 24, which is fastened on the outer side of the housing wall 18. A part of the fan 21 together with the slats 23 lies in the space 25 surrounded or enclosed by the coaming 24. The coaming 24 engages in the interior 26 of a pan-shaped cover 27, which comprises a closed front 28 and a circumferential rim 29 that partially engages over the coaming 24. The cover 27 is fastened on the coaming 24 by means of screw connections 37 (only represented schematically) and lies at a distance from it, so as to produce an air feed channel 30 which forms an air-permeable connection between the fan 21, or the ventilation hole 22, and the surroundings 31 of the cabinet housing 16. The fan 21 can therefore take in air from the surroundings 31 and transport it into the interior 20 of the housing 16. To this end, the air flows for example in the direction of the arrow 32 into the air feed channel 30, then in the direction of the arrow 33 around the front edge 36 of the coaming 24 into the interior 25, and from there in the direction of the arrow 34 through the fan 21 into the interior 20 of the housing 16. With reversed operation of the fan 21, it is of course possible to discharge air from the interior 20 into the surroundings 31, in which case the air flows in the opposite direction to the arrows 34, 33 and 32.

The enclosing outer surface 35 of the coaming 24 is designed concavely, so that water penetrating laterally cannot enter the interior 25 via the front edge 36 of the coaming 24.

Figure 3:
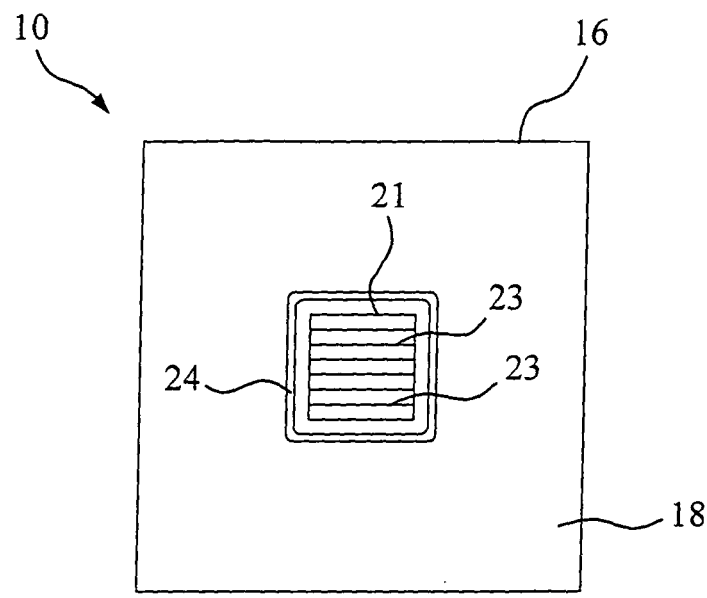
FIG. 3 shows an external view of the switchgear cabinet with the cover removed.

FIG. 3 shows an external view of the switchgear cabinet 10 with the cover 27 removed, where it can be seen that the coaming 24 has an essentially square circumferential contour.

Figure 4:
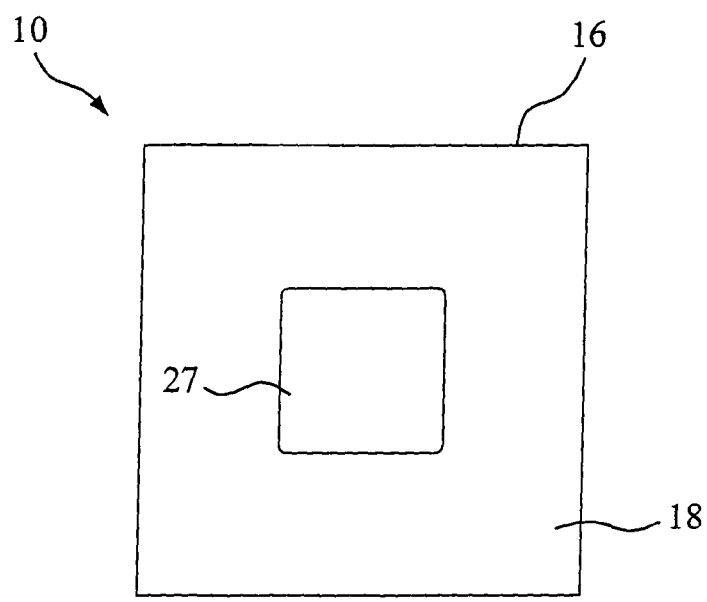
FIG. 4 shows the external view according to FIG. 3 with the cover fitted.

FIG. 4 furthermore shows the external view according to FIG. 3 with the cover 27 fitted, so that it can be seen that the cover 27 also has an essentially square circumferential contour.

LIST OF REFERENCE NUMERALS 1 wind turbine
2 foundation
3 tower
4 power house
5 support/holder
6 rotor
7 rotor hub
8 rotor blade 9 electrical generator
10 switchgear cabinet
11 electronic components
12 pitch drive
13 longitudinal axis of the rotor blade
14 wind
15 rotor axis
16 cabinet housing
17 housing wall
18 housing wall
19 housing wall
20 housing interior
21 filter fan
22 ventilation hole
23 slat
24 coaming
25 space surrounded by coaming
26 interior of the cover
27 cover
28 front of the cover
29 rim of the cover
30 air feed channel
31 surroundings
32 air flow
33 air flow
34 air flow
35 outer surface of the coaming
36 front edge of the coaming
37 screw connection

The invention claimed is:

1. A switchgear cabinet for a wind turbine, comprising:
a cabinet housing having a wall with at least one ventilation hole defined therein, the ventilation hole having a perimeter, the cabinet housing having an outer side;
at least one fan disposed in the cabinet housing and supported on the cabinet housing so as to be disposed in front of or in the ventilation hole;
a circumferential coaming disposed on the outer side of the cabinet housing, the coaming being spaced from the perimeter of the ventilation hole and surrounding the ventilation hole; and
a pan-shaped cover having a closed front and a rim, the cover disposed over the coaming with the rim extending around the coaming, the cover being spaced from the coaming so as to define at least one air-permeable connection between the fan and the surroundings of the cabinet.

2. A switchgear cabinet in accordance with claim 1, wherein the coaming is interconnected with an interior of the cover.

3. A switchgear cabinet in accordance with claim 1, wherein the cover and the coaming have corresponding circumferential contours.

4. A switchgear cabinet in accordance with claim 1, wherein the coaming and the cover each have a polygonal circumferential contour.

5. A switchgear cabinet in accordance with claim 1, wherein the coaming has a circumferential outer surface with a circumferential indentation.

6. A switchgear cabinet in accordance with claim 1, wherein the coaming has a circumferential outer surface, the outer surface being concave.

7. A switchgear cabinet in accordance with claim 1, wherein the cover is U-shaped in cross section.

8. A switchgear cabinet in accordance with claim 1, wherein the fan extends through the ventilation hole.

9. A switchgear cabinet in accordance with claim 1, wherein the fan has slats.

10. A switchgear cabinet in accordance with claim 1, wherein the circumferential rim being spaced from the outer surface of the wall.

11. A switchgear cabinet in accordance with claim 10, wherein the closed front of the cover is on a side of the cover remote from the wall, the circumferential rim extending from the closed front towards the wall and overlaping with the coaming.

12. A wind turbine, comprising:
a holder;
a rotor rotatably mounted on the holder, the rotor having at least two rotor blades;
an electrical generator coupled to the rotor; and
at least one switchgear cabinet according to claim 1.

13. A switchgear cabinet in accordance with claim 1, wherein the cover is fastened on the coaming.

* * * * *